United States Patent [19]

Spratt et al.

[11] Patent Number: 5,316,957
[45] Date of Patent: May 31, 1994

[54] METHOD OF FORMING A RECESSED CONTACT BIPOLAR TRANSISTOR

[75] Inventors: David B. Spratt, Plano; Robert L. Virkus, Dallas; Robert H. Eklund; Eldon J. Zorinsky, both of Plano, all of Tex.

[73] Assignee: Texas Instruments Incorporated, Dallas, Tex.

[21] Appl. No.: 85,676

[22] Filed: Jun. 30, 1993

Related U.S. Application Data

[60] Continuation of Ser. No. 431,270, Nov. 3, 1989, abandoned, which is a division of Ser. No. 149,785, Jan. 29, 1988, Pat. No. 4,897,703.

[51] Int. Cl.$^5$ ........................................... H01L 21/265
[52] U.S. Cl. ........................................ 437/31; 437/33; 437/61; 437/63; 437/909; 148/DIG. 10
[58] Field of Search .............. 437/31, 162, 415, 56, 437/57, 61, 62, 63, 917, 909, 32, 33; 148/DIG. 9, DIG. 10, DIG. 102

[56] References Cited

U.S. PATENT DOCUMENTS

| | | | |
|---|---|---|---|
| 4,333,227 | 6/1982 | Horng et al. | 437/33 |
| 4,521,952 | 6/1985 | Riseman | 437/33 |
| 4,738,624 | 4/1988 | Iyer et al. | 437/33 |
| 4,784,966 | 11/1988 | Chen | 437/56 |
| 4,868,135 | 9/1989 | Ogura et al. | 437/56 |
| 4,957,875 | 9/1990 | Akbar et al. | 148/DIG. 9 |

Primary Examiner—Brian E. Hearn
Assistant Examiner—Tuan Nguyen
Attorney, Agent, or Firm—Mark E. Courtney; Wade James Brady; Richard L. Donaldson

[57] ABSTRACT

Disclosed is a scaled, self aligned, bipolar transistor and a method of fabrication which is compatible with MOSFET device structures. A transistor intrinsic base region is formed in the face of an isolated epitaxial region and polysilicon is deposited, patterned and etched to form emitter regions. An oxide cap and first sidewall oxide spacers are formed on the polysilicon emitters and the single crystal silicon is etched using the oxide covered emitters as a mask to form recessed regions in the epitaxial layer. The extrinsic base region is then formed adjacent at least one side of the base by implanting appropriate dopants into one of the recessed regions. A second sidewall oxide spacer is then formed on the vertical base emitter structure and a heavily doped collector contact region is formed by implanting appropriate dopants into another one of the recessed silicon regions. The collector contact region is self aligned to the second sidewall oxide spacer which prevents the contact of base and heavily doped collector. Finally, the oxide cap covering the upper emitter surfaces is removed and emitter, base and collector contact regions are silicided to reduce contact resistance.

16 Claims, 6 Drawing Sheets

METHOD OF FORMING A RECESSED CONTACT BIPOLAR TRANSISTOR

This application is a continuation of application Ser. No. 07/431,270, filed Nov. 3, 1989, abandoned, which is a division of application Ser. No. 07/149,785, filed Jan. 29, 1988, U.S. Pat. No. 4,897,703.

RELATED APPLICATIONS

"A BICMOS Process for Forming Self-Aligned NPN Emitters and Bases and MOSFET/Source Drains", by Robert H. Havemann, Ser. No. 057,871, filed Jun. 2, 1987 and "Bipolar Transistor Fabrication Using CMOS Techniques", by David Spratt and Rajiv Shah, Ser. No. 008,906, filed Jan. 30, 1987, both assigned to Texas Instruments.

TECHNICAL FIELD OF THE INVENTION

The present invention relates in general to bipolar/CMOS semiconductor processing, and more specifically to the process of forming a scaled bipolar transistor structure that is compatible with the formation of CMOS structures on a single semiconductor substrate.

BACKGROUND OF THE INVENTION

The challenges associated with device scaling or reducing the size of device geometries have become a focus of attention for both bipolar and MOS VLSI technologies in recent years. In addition, the integration of FET structures and bipolar transistors on a single substrate has become very desirable. Each of these technologies provides inherent advantages. Bipolar transistors provide high transconductance and, as a result, are very suitable for high speed VLSI devices. On the other hand, CMOS technology offers the advantages of low power operation and very high packing density. It has become clear that the exploitation of the high current driving capabilities of the bipolar transistor is important and that bipolar device scaling is critical to obtaining even higher levels of bipolar or merged bipolar CMOS integration.

Previous efforts to scale the geometries of the bipolar transistor have been directed to reducing the lateral dimensions of the device by photolithographically scaling the feature sizes. Using this approach, the desired breakdown voltages are typically accomplished by maintaining critical lateral spacings through appropriate adjustments in photomask pattern dimensions. By incorporating processes that include the use of polysilicon and self-alignment techniques, even further advances in performance and packing density have been realized. These improvements are largely the result of minimizing excessive parasitic extrinsic regions of the bipolar device. One recent technique to reduce the collector-base area is to self-align the emitter to the base by making direct contact to the emitter with a polysilicon layer. Polysilicon has also been used to contact the base of the transistor which has the effect of reducing the collector to base area. See, for example, Cuthbertson et al, Self-Aligned Transistors with Polysilicon Emitters for Bipolar VLSI, IEEE Trans. Electron Devices, vol. ED-32, No. 2, pp. 242-247., Feb. 1985.

Such techniques have more recently been implemented in a bipolar-based BICMOS process which uses the second level polysilicon layer of the CMOS process to form the bipolar polysilicon emitter. This allows a small sized, shallow emitter structure without additional processing steps (see Ikeda et al, High-Speed BICMOS Technology with a Buried Twin Well Structure, IEEE Trans. Electron Devices, vol. ED-34, No. 6, pp. 1304-1309, June 1987).

Other processes for producing multilayer bipolar and MOS structures having reduced packing density have incorporated the use of vertical or sidewall insulating layers. See for example J. Riseman U.S. Pat. No. 4,234,362, issued Nov. 18, 1980 or V. L. Rideout U.S. Pat. No. 4,085,498, issued Apr. 25, 1978.

While the above described methods have allowed ever increasing improvement in device performance and packing density, there exists a need for even further reduction in feature size that is not limited by photolithography for controlling critical dimensions between diffusions. In addition, there exists a need for improving device performance by eliminating parasitic peripheral diode effects and the level of stored charge in the collector region. Finally, it would be desirable to provide a method of producing a scaled bipolar device having the above improvements with a simplified manufacturing process that is compatible with various bulk and silicon-on-insulator isolation schemes as well as CMOS process technology.

It is therefore an object of the invention to provide a method of making a bipolar transistor that reduces the area of the transistor structure and improves the packing density of integrated circuits incorporating said transistor. It is also an object of the invention to provide a bipolar transistor having a reduced extrinsic base area with a corresponding reduction in the parasitic capacitance to improve device switching performance. It is yet another object of the present invention to provide a simplified bipolar transistor process which eliminates the need for a highly doped buried collector layer. It is still another object of the invention to provide a bipolar transistor process which improves voltage breakdown control by device scaling which is independent of photolithographic operations. An additional object of the invention is to provide a bipolar transistor that reduces the effect of parasitic emitter to base diode characteristics. Finally, it is a further object of the present invention to provide a bipolar transistor process that is (automated) layout compatible with CMOS manufacturing processes.

SUMMARY OF THE INVENTION

In accordance with the present invention there is provided a method of manufacturing a bipolar semiconductor device having reduced dimensions and improved operating characteristics while being process compatible with MOS device structures. An intrinsic base region is formed in a epitaxial layer overlying an insulator and a polysilicon layer is thereafter deposited, patterned and etched to form emitter regions. An insulating layer is formed on the upper surfaces and side walls of the polysilicon emitters to provide a first sidewall spacer. The single crystal silicon is then selectively etched through a major portion of the intrinsic base and self-aligned to the sidewall insulator covering the emitter regions. A heavily doped base contact region is then formed adjacent at least one side of the base-emitter pedestal previously formed and a second sidewall insulating spacer is formed over the base-emitter structure. The collector contact region is formed adjacent a second side of the base-emitter structure by implanting the appropriate dopant while using the second sidewall spacer as a portion of the implant mask to offset the heavily doped collector contact region from the intrinsic base. Finally, the insulating layer on the surface of the polysilicon emitter regions is patterned and etched and emitter, base contact, and collector contact regions are silicided. The device may then be processed using standard methods to provide appropriate interconnect metallization and passivation.

A technical advantage is provided in that by separating the base and collector contacts from the emitter in the vertical direction, parasitic diode action between the base and collector contacts is reduced or eliminated. A further technical advantage is the improved device switching speed resulting from the close proximity of the collector contact to the emitter which allows for a reduction in the area of the lightly doped collector and a corresponding reduction in the amount of stored charge in this region. In addition, improved device switching performance is attained by a reduction in the extrinsic base area and a resulting reduction in associated parasitic capacitances. A further technical advantage is the close spacing of collector contact and emitter regions which allows for the elimination of the heavily doped buried layer and buried layer contact which simplifies the manufacturing process. Yet another technical advantage of the present invention is the reduction in area required for the scaled bipolar transistor which greatly improves packing density allowing higher levels of device integration. Finally, an additional technical advantage is the improved breakdown voltage control resulting from a device scaling method which is independent of photolithographic limitations. Additionally, the process disclosed herein is compatible with CMOS device processing and numerous bulk and silicon isolation schemes making it ideally suitable for BICMOS VLSI applications.

BRIEF DESCRIPTION OF THE DRAWINGS

For a more complete understanding of the present invention and the advantages thereof, reference is now made to the following description taken in conjunction with the accompanying drawings in which.

DETAILED DESCRIPTION OF THE INVENTION

Figure 1:
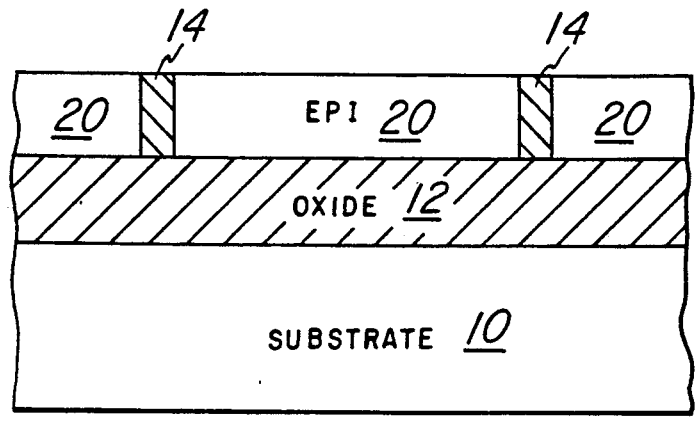
FIG. 1 illustrates the initial structure of a preferred embodiment of the transistor which includes an epitaxial layer overlying an oxide insulator and trenches through the epitaxial layer which are filled with insulating material for device isolation.

Referring to FIG. 1, there is shown a cross-sectional view of a silicon on insulator structure that includes a semiconductor layer 10 having an overlying oxide layer 12 and an epitaxial silicon layer 20 overlying layer 12. Totally isolated epitaxial silicon islands may be formed by etching isolation trenches 26 through layers 20 and subsequently refilling these trenches by depositing an oxide or suitable insulating material 14. This method results in closely spaced epitaxial substrate regions 20 that form the active device areas. A similar structure may be fabricated by using the method disclosed in U.S. patent application Ser. No. 810,001, filed Dec. 17, 1985 and entitled "Semiconductor Isolation Using Trenches and oxidation of Anodized Silicon Sublayer". An additional description of an isolated silicon structure which would be suitable for use in the present method may be found in U.S. patent application Ser. No. 806,258, filed Dec. 6, 1985 and entitled "High Definition Anodized Sublayer Boundary". The two patent applications cited above are herein incorporated by reference. It should also be noted that the bipolar transistor structure of the present invention may be formed in a silicon substrate that is not totally surrounded by insulating material. That is to say that the method need not start with a silicon on insulator active area but may begin by forming these active areas by using traditional bulk silicon isolation techniques. Such techniques may include recessed or non-recessed LOCOS isolation or various deep trench isolation methods.

The steps used in forming the bipolar transistor structure of the present invention in a silicon substrate which is not surrounded by insulating material are essentially the same as are summarized above: an intrinsic base region of a first conductivity type is formed in a semiconductor substrate region of a second conductivity type, an emitter region is then formed in a layer of semiconductor material doped to the second conductivity type and overlying the base region of the first conductivity type, recesses are etched through a major portion of the base region at locations spaced from the emitter region, impurities of the first conductivity type are introduced into some of the recesses to form base contact areas adjacent to the base regions, and impurities of the second conductivity type are introduced into others of the recesses in the base region so as to form collector contacts to the semiconductor substrate of the second conductivity type.

Figure 2:
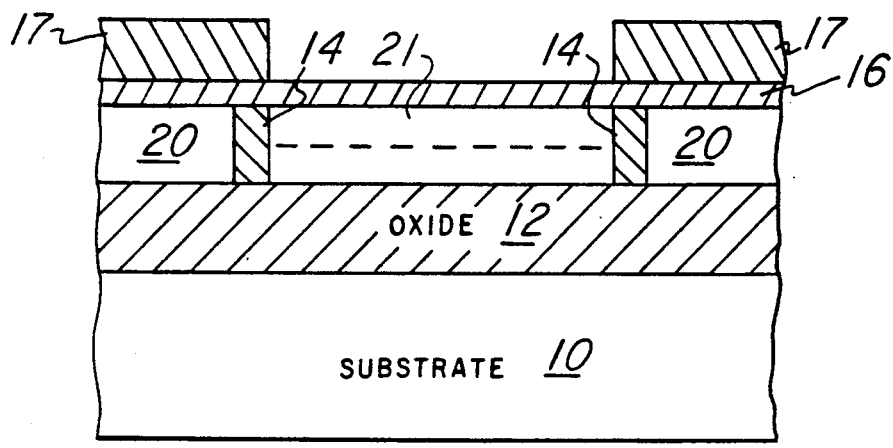
FIG. 2 illustrates a cross-sectional view of the isolated structure after the formation of the intrinsic base region in an upper portion of the epitaxial layer with a protective oxide layer in place.

Referring now to FIG. 2, the process continues by growing protective oxide layer 16 on the surface of the structure as shown in FIG. 1. This oxide may be grown to a thickness of, for instance, 120 Angstroms. Following this oxidation step, a base blocking photoresist layer 17 is deposited and patterned to define intrinsic base regions in the desired epitaxial silicon layers. Photoresist 17 is etched and Boron is implanted in the upper portion of epitaxial layer 20 to a dosage of approximately 1.5E14 at an implant energy of 60 KEV to form intrinsic base layer 21. Portions of base layer 21 will become the base region of bipolar NPN transistors to be described in detail hereinbelow.

Figure 3:
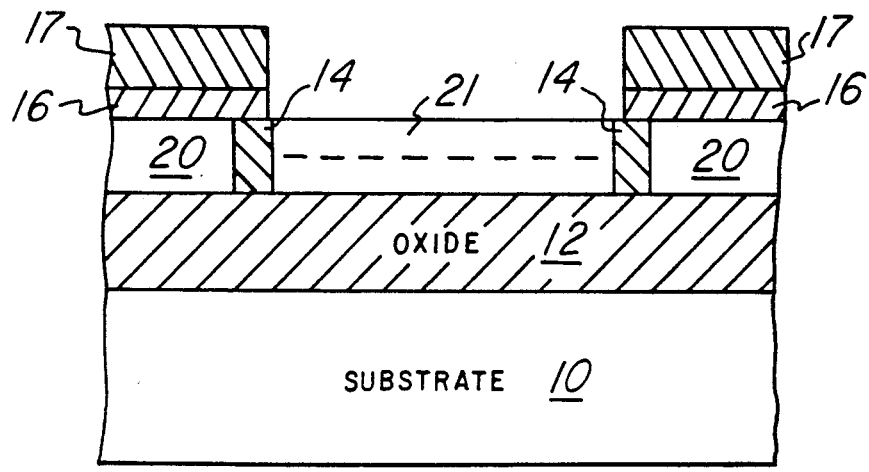
FIG. 3 illustrates the structure after removal of the protective oxide from the active device region.
Figure 4:
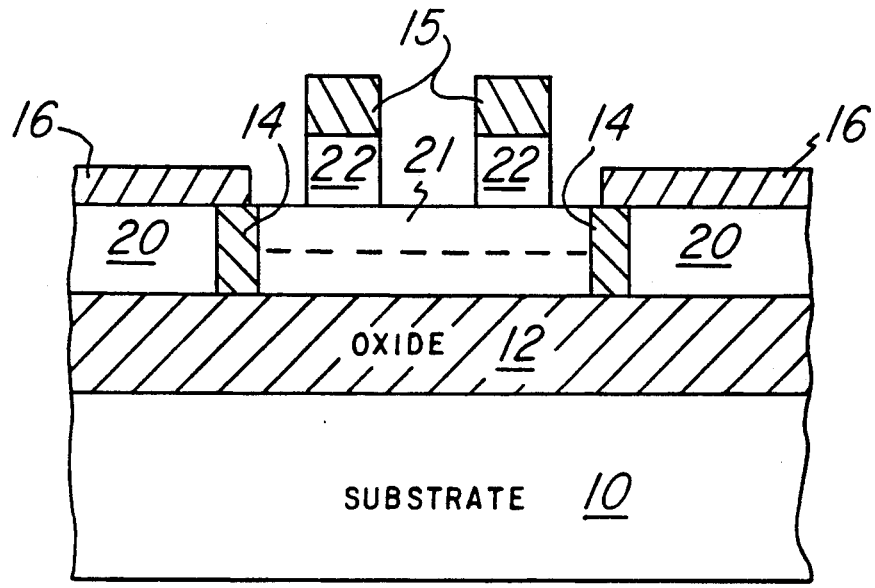
FIG. 4 illustrates a cross-sectional view of isolated base structure after the formation of oxide capped polysilicon emitter regions thereon.

With patterned photoresist layer 17 remaining in place, the portions of protective oxide layer 16 that cover base layer 21 are etched as is shown in FIG. 3. The photoresist layer 17 is then stripped. Referring next to FIG. 4, a layer of undoped polysilicon is deposited by using a low pressure chemical vapor deposition (LPCVD) technique. This polysilicon layer is then doped by implanting phosphorus to a dosage of approximately 2.0E16 at an implant energy of 100 KEV. Thereafter an insulating layer of oxide is deposited to a thickness of approximately 2000 Angstroms. The oxide deposition utilizes a process referred to as Tetraethoxysilane (TEOS) deposition which forms an insulator that etches at a faster rate than thermally grown oxide. Next, a layer of photoresist (not shown) is deposited and patterned to define the self-aligned polysilicon emitter structure. The TEOS layer is then selectively etched and following that operation, the polysilicon layer is etched away in those areas not covered by the remaining TEOS pattern. As shown in FIG. 4, the resulting structure includes at least one polysilicon emitter 22 formed on extrinsic base layer 21 an capped with insulating TEOS layer 15.

Figure 5:
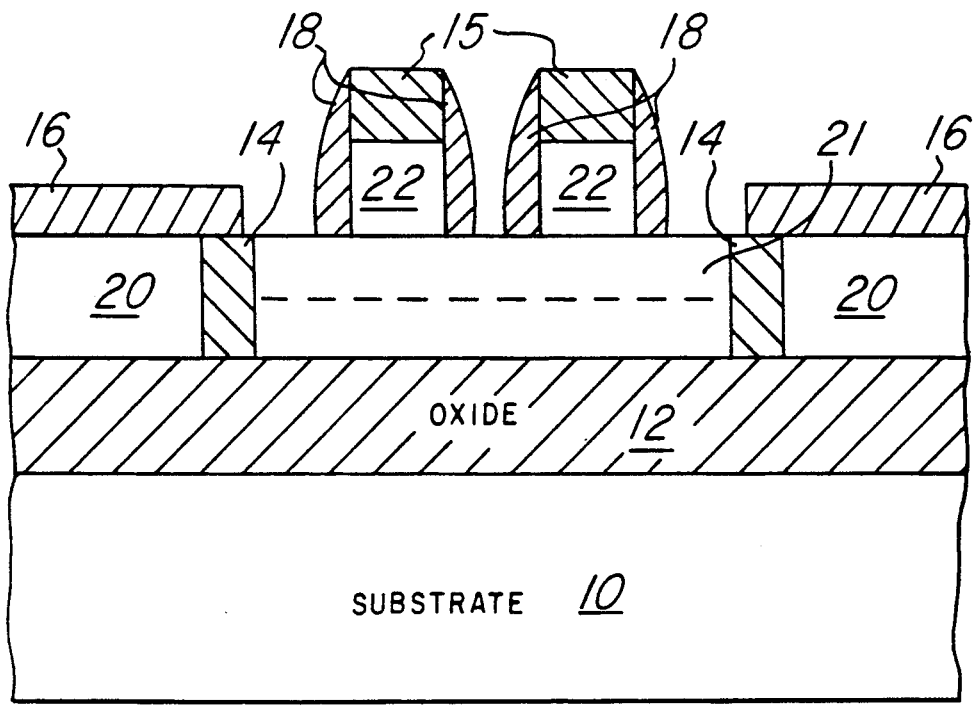
FIG. 5 illustrates a cross-sectional view after the formation of a first sidewall insulator spacer on the sides of the capped emitter structure.

The process continues by depositing a insulating TEOS layer approximately 2000 Angstroms in thickness. This layer is then patterned and anisotropically etched to leave only the sidewall oxide spacer 18 on the sides of the capped polysilicon emitter structure (layers 22 and 15) as shown in FIG. 5. The sidewall oxide spacer 18 serves to "nest" the polysilicon emitter 22 by totally surrounding it with insulating material and also provides a masking material for subsequent etching steps and implantation operations.

Figure 6:
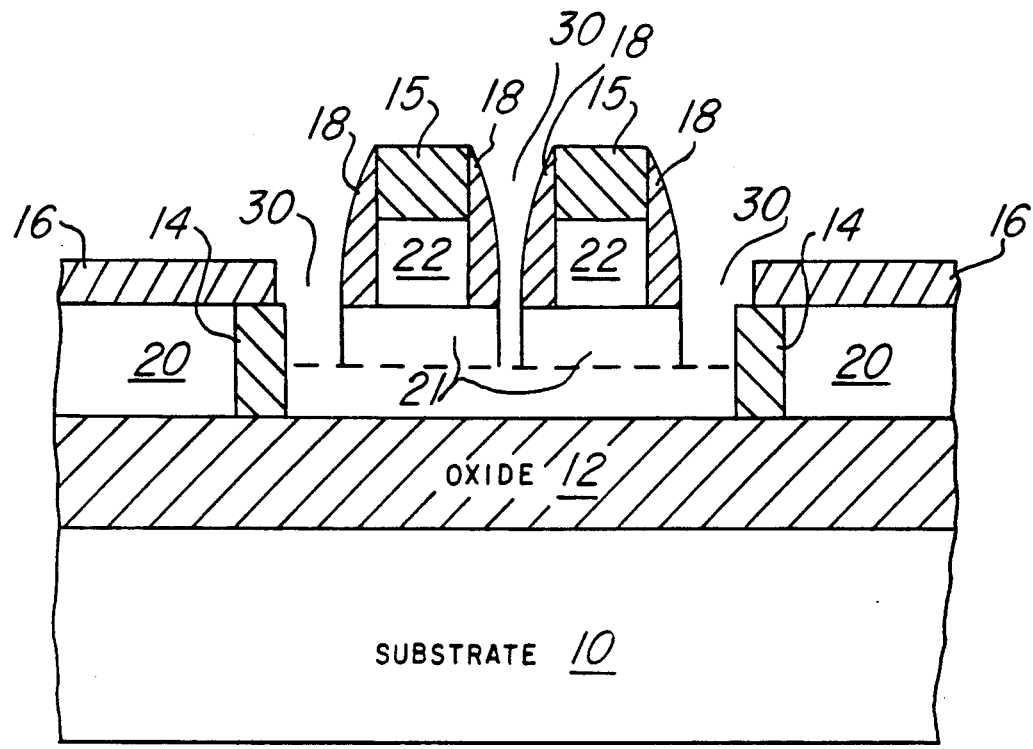
FIG. 6 illustrates a cross-sectional view of the active device structure after the process of selectively etching portions of the base layer to form stacked emitter-base structures in the active device regions.

As shown in FIG. 6, the structure is next patterned and the epitaxial silicon intrinsic base layer 21 is etched to a depth of approximately 3500 Angstroms to form contact recesses 30. The recesses etched in the silicon during this step of the process should penetrate at least a major portion of base layer 21 and will form the base and collector contact recessed regions. The resulting structure includes isolated stacked structures which have an N type polysilicon emitter 22 overlying a P type base layer 21 on an N type epitaxial silicon layer 20.

Figure 7:
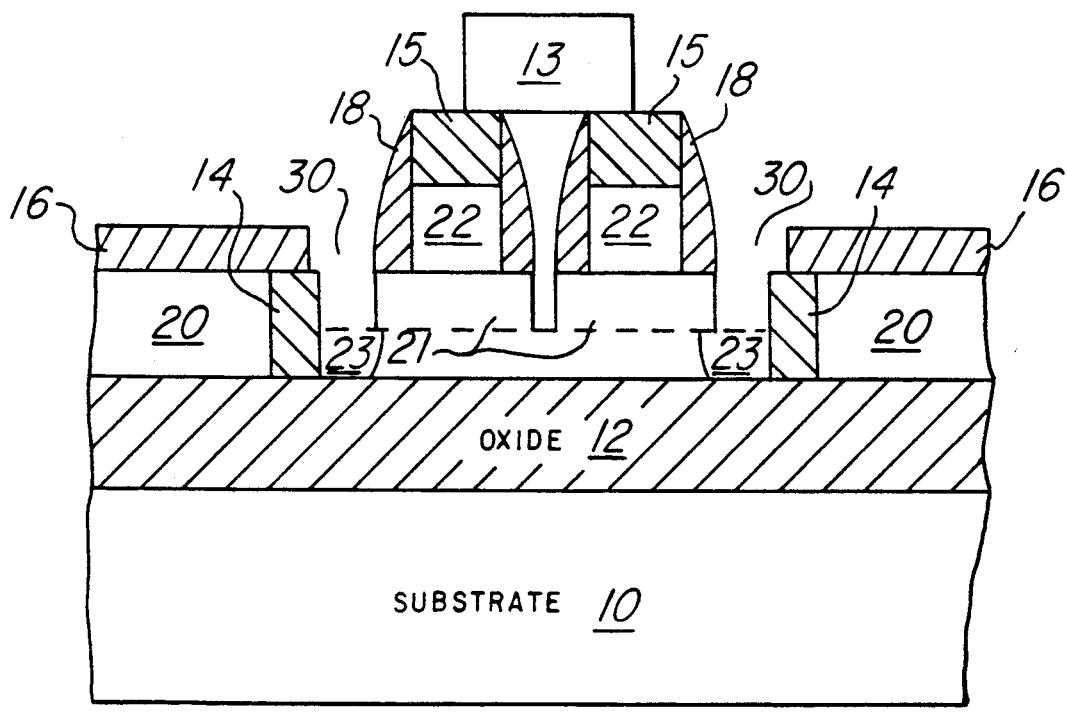
FIG. 7 illustrates a cross-sectional view of the device after the implantation of the self-aligned extrinsic base.

Referring now to FIG. 7, a base contact blocking resist layer 13 is formed over the structure and patterned to define base contact regions 23 in the contact recesses 30 on one side of the base-emitter stacked structure. Boron is then ion implanted at a dosage level of approximately 5.0E15 and an implant energy of 50 KEV to form the base contact regions 23 in epitaxial silicon layer 20. Note that the sidewall oxide spacer 18 on the base-emitter structure forms an appropriate implant mask during this operation and the heavily boron doped region 23 makes contact to base layer 21.

Figure 8:
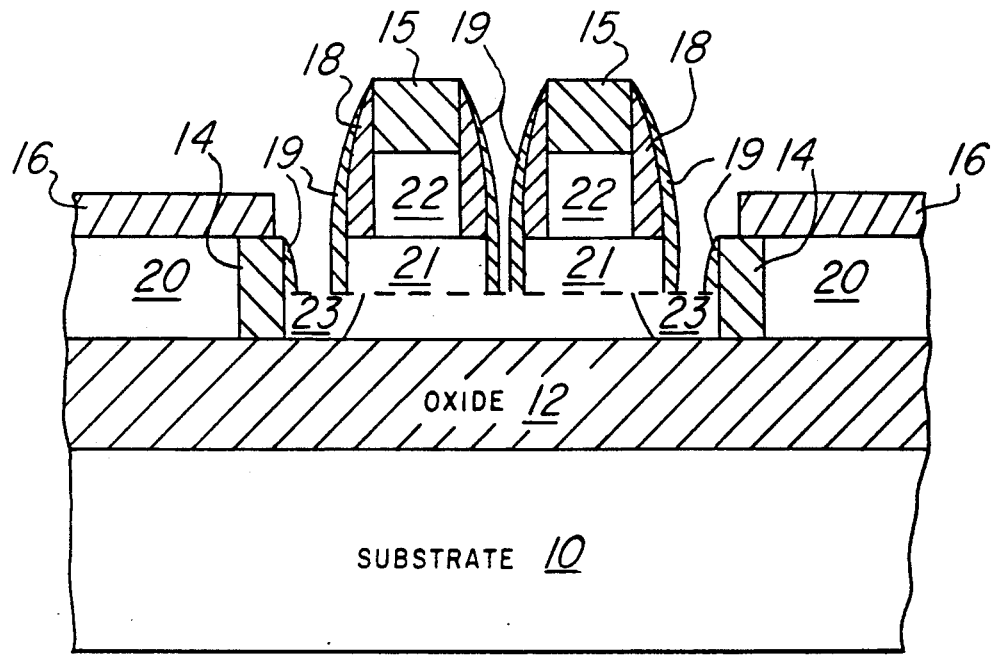
FIG. 8 illustrates a cross-sectional view of the transistor structure after the formation of a second sidewall insulator spacer on the sides of the stacked emitter-base structure.

The process continues by depositing an insulating TEOS layer having a thickness of approximately 3500 Angstroms. This layer is then patterned an anisotropically etched to form a second sidewall oxide spacer 19 which covers the sides of base layer 21, sidewall oxide spacer 18 and the sides of the oxide isolation material 14 while exposing reduced area contact regions in the base-collector contact recesses 30 as shown in FIG. 8.

Figure 9:
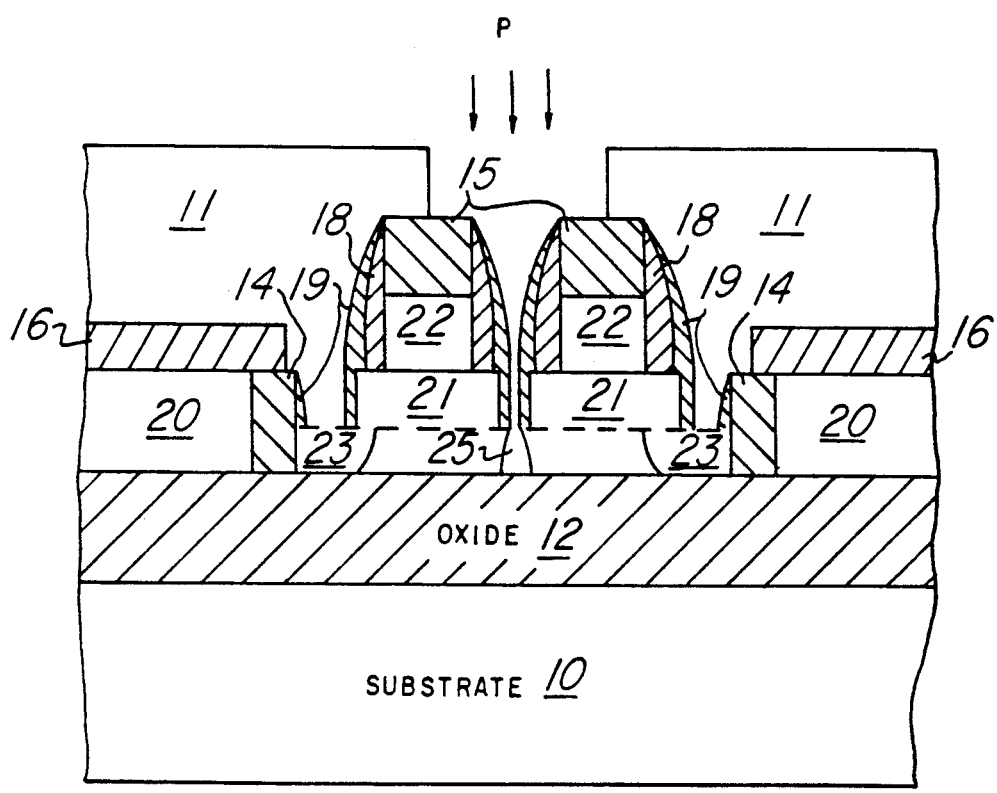
FIG. 9 illustrates a cross-sectional view of the device after collector contact patterning and ion implantation.

A layer of collector contact blocking resist 11 is next deposited and patterned to define the collector contact region 25. After etching layer 11, phosphorus is ion implanted at a dosage of approximately 2.0E16 and an implant energy of 100 KEV to form a heavily doped collector contact region 25 as shown in FIG. 9. Note that the sidewall oxide spacer 19 serves as a mask during this operation to ensure that contact region 25 is appropriately spaced from base layer 21. The structure may now be subjected to a high temperature emitter anneal process of, for example, 900 degrees centigrade for 10 to 15 minutes. From an examination of the transistor structure at this stage of the process, it can be appreciated that by the use of the silicon etch and the two sidewall oxide spacers, the active emitter is separated from the heavily doped base and collector contacts in the vertical direction allowing a reduction in overall transistor area. In addition, this is accomplished without the limitations of photolithographically defining a lateral spacing between diffusions. Moreover, the ability to space the heavily doped collector contact in close proximity to the base layer 21 provides a transistor with a low Rcs value thereby eliminating the need to incorporate a low resistance, deep collector region.

Figure 10:
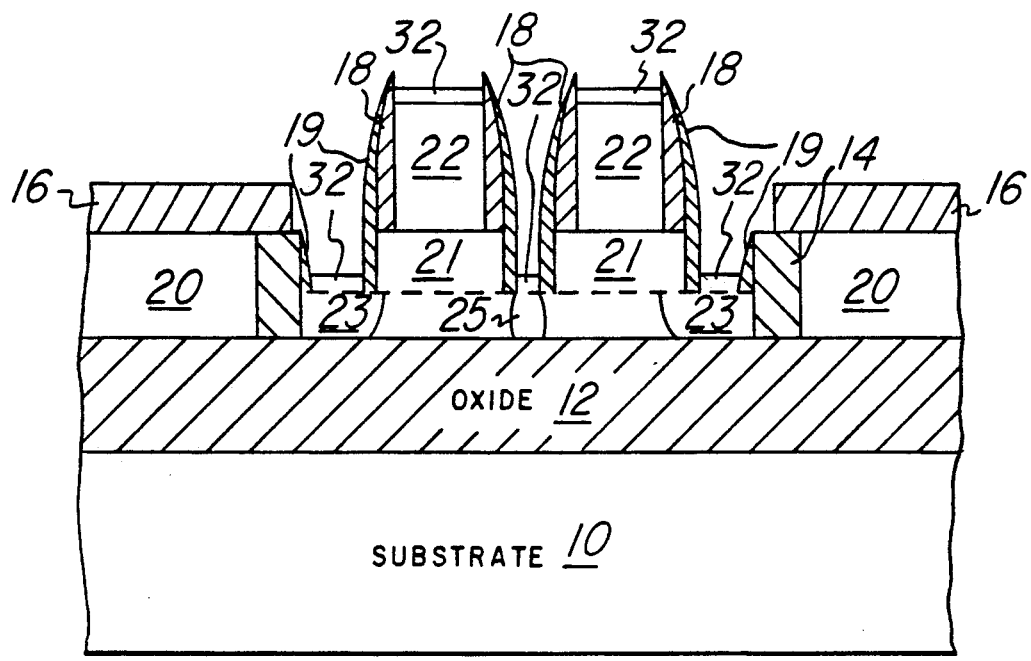
FIG. 10 illustrates a cross-sectional view of the device structure after the removal of the emitter oxide cap and the formation of a metal silicide on the base, emitter and collector silicon surfaces.

Referring next to FIG. 10, the process continues by depositing and patterning a cap oxide resist (not shown) and thereafter etching the polysilicon emitter cap oxide 15 to expose the upper surface of the phosphorus doped emitter 22. A layer of metal such as platinum having a thickness of approximately 450 Angstroms is next deposited and thereafter sintered to form metal silicide layers 32 on polysilicon emitter 22, base contact regions 23, and collector contact region 25. The portions of the platinum that do not react to form titanium disilicide are stripped using an appropriate etchant. The siliciding process is described in U.S. Pat. No. 4,545,116, which is incorporated herein by reference and will not be further described here.

Figure 11:
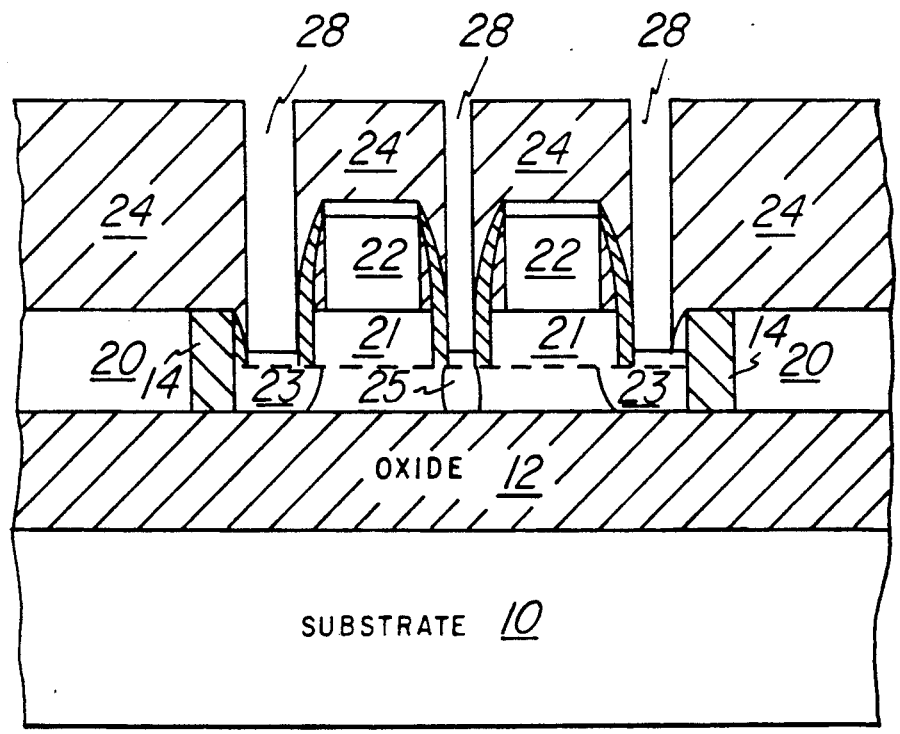
FIG. 11 illustrates a cross-sectional view of the transistor structure after deposition, patterning and etching an interconnect insulating layer.
Figure 12:
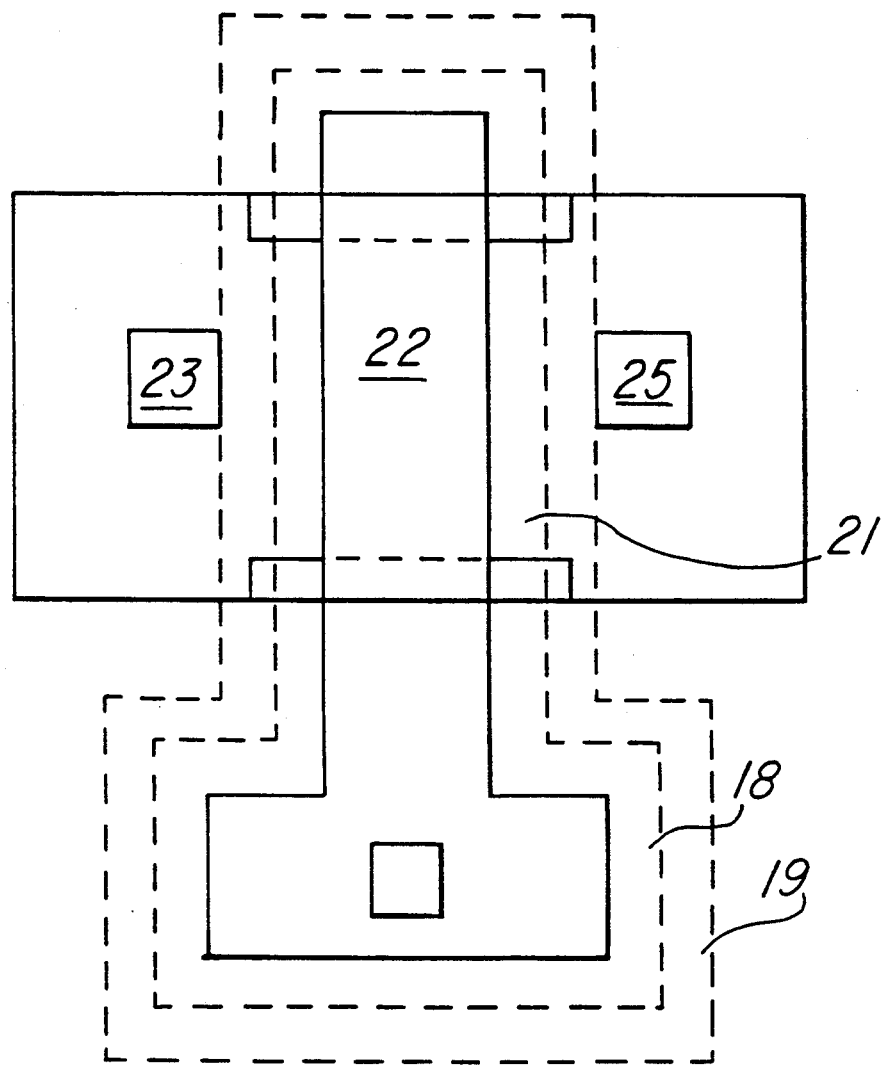
FIG. 12 illustrates a top view of the transistor structure.

As shown in FIG. 11, an oxide insulating layer 24 is next deposited on the surface of the structure and thereafter planarized to provide acceptable contours for subsequent interconnect metallization. Oxide layer 24 is then patterned and etched to form suitable contact vias 28 in the desired emitter, base and collector contact regions. A first level metal pattern of, for instance, an aluminum-titanium tungsten alloy may then be formed to make contact to the desired silicided surfaces through vias 28 and patterned/etched to form an appropriate interconnect. Additional levels of interconnect may be desirable as dictated by the complexity of the circuit design.

In summary, there has been provided a method for fabricating a scaled, self-aligned bipolar transistor. The method includes a first step of forming a shallow intrinsic base region in an isolated epitaxial silicon layer and thereafter forming oxide capped polysilicon emitters which are nested by forming a first oxide insulator on the sidewall of the emitter structure. A silicon etch is used to form recessed contact regions for base and collector contacts and the base contact is formed by a self-aligned ion implantation of a suitable dopant using the first sidewall oxide as a part of the implantation mask. A second sidewall oxide spacer is formed on the sides of the on the emitter-base stacked structure and the collector contact is formed by ion implanting into an appropriate recessed contact region a suitable dopant using the second sidewall spacer as a portion of the implantation mask. The collector contact so formed is spaced from the base by the second sidewall spacer and because this dimension may be made very small, the need for a heavily doped buried collector region is eliminated. The bipolar transistor proposed herein may be incorporated into a standard double polysilicon CMOS process flow having fewer additional photomasking steps than conventional BICMOS processes. In addition, the bipolar transistor disclosed herein is fully compatible with silicon on insulator (SOI) technology. The presence of a buried oxide completely confines the heavily doped P-type depletion region at the silicon oxide interface which significantly reduces the extrinsic base capacitance.

Although the present invention has been disclosed and claimed herein, it should be understood that various changes, substitutions and alterations can be made without departing from the spirit and scope of the invention as defined by the appended claims.

We claim:

1. A method for forming a transistor, comprising the steps of:
    forming a base region of a first conductivity type in the upper portion of a semiconductor substrate, the remaining portion of said semiconductor substrate forming a collector region of a second conductivity type;
    forming a base region of a first conductivity type in the upper portion of a semiconductor substrate, the remaining portion of said semiconductor substrate forming a collector region of a second conductivity type;
    forming an emitter region in a layer of semiconductor material doped to said second conductivity type overlying said base region;
    forming recesses in said base region at locations laterally spaced from said emitter region, said recesses formed by:
        (a) forming an insulating layer on the surface of said layer of semiconductor material;
        (b) forming a sidewall insulator on the side portions of said layer of semiconductor material; and
        (c) etching recesses through at least a major portion of said base region at locations adjacent to said sidewall insulator;
    introducing impurities of said first conductivity type in selected ones of said recesses to form a base contact region adjacent to said base region; and
    introducing impurities of said second conductivity type in other ones of said recesses at locations laterally spaced from said base contact region to form a collector contact region adjacent to said semiconductor substrate.

2. The method recited in claim 1, wherein said step of forming a base region comprises:
    providing a first substrate;
    forming a first insulating layer on said first substrate;
    forming an epitaxial layer on said first insulating layer;
    forming trenches at selected locations through said epitaxial layer to form said semiconductor substrate;
    forming a second insulating layer on said epitaxial layer;
    selectively removing portions of said second insulating layer;
    introducing a dopant of said first conductivity type into an upper portion of said semiconductor substrate.

3. The method recited in claim 1, wherein said semiconductor layer comprises a layer of polysilicon.

4. The method recited in claim 1, wherein said step of introducing impurities of said first conductivity type comprises implanting boron into said selected ones of said recesses at locations that are self-aligned to a sidewall insulator formed on the side portions of said layer of semiconductor material.

5. The method recited in claim 1, wherein said step of introducing impurities of said second type comprises:
    forming a sidewall insulator overlying at least a portion of the sides of said emitter region and the walls of said recesses; and
    implanting phosphorus into said other ones of said recesses.

6. The method recited in claim 1, further comprising forming a metal silicide layer on surface portions of said emitter region, said base contact region and said collector contact region.

7. A method for forming a bipolar transistor in an integrated circuit comprising:
    forming a collector region of a first conductivity type in a semiconductor substrate;
    forming a base region of a second conductivity type in an upper portion of said collector region;
    forming an emitter region of said first conductivity type in a layer of semiconductor material formed on said base region;
    forming an insulating layer on the surface of said emitter region;
    forming a first sidewall insulator on at least the side portions of said emitter region;
    etching recesses through at least a portion of said base region at locations adjacent to said sidewall insulator;
    implanting impurities of a second conductivity type into selected ones of said recesses on a first side of said emitter region to form a base contact region;
    forming a second sidewall insulator on said first sidewall insulator and on the walls of said recesses; and
    implanting impurities of a first conductivity type into other ones of said recesses on a second side of said emitter region to form a collector contact region.

8. The method recited in claim 7, wherein said semiconductor substrate is formed by the method comprising:
    providing a wafer of silicon material;
    forming an insulating layer on said wafer;
    forming a layer of epitaxial silicon on said insulating layer;
    etching trenches through said layer of epitaxial silicon and at least a major portion of said insulating layer at selected locations; and
    filling said trenches with an insulating material to thereby form isolated islands of said epitaxial silicon.

9. The method recited in claim 7, wherein the steps of forming said first and second sidewall insulators comprises depositing an oxide layer and anisotropically etching said oxide layer.

10. The method recited in claim 7, wherein said first sidewall insulator forms at least a portion of the mask for said step of implanting impurities of a second conductivity type to thereby self-align said base contact region to said base region.

11. The method recited in claim 7, wherein said second sidewall insulator forms at least a portion of the mask for said step of implanting impurities of a first conductivity type to thereby separate said collector contact from said base region by a predetermined amount.

12. A method for forming a semiconductor structure, comprising the steps of:
forming a first region of a first conductivity type in the upper portion of a semiconductor substrate, said substrate being of a second conductivity type,
forming a second region of said second conductivity type overlying said first region,
forming recesses in said first region at locations laterally spaced from said second region;
introducing impurities of said first conductivity type in a first one of said recesses;
introducing impurities of said second conductivity type in a second one of said recesses at a location laterally spaced from said first region; and
forming a layer of insulating material adjacent said second region and using said layer as at least part of the mask for performing said step of forming recesses in said first region.

13. The method of claim 12, further comprising the step of forming a layer of insulating material in at least one of said recesses and adjacent at least part of the remaining material of said first region and using said layer as at least part of the mask for performing said step of introducing impurities of said second conductivity type.

14. A method for forming a transistor, comprising:
forming a base region of a first conductivity type in a first layer of semiconductor material of a second conductivity type;
forming an emitter region in a second layer of semiconductor material doped to said second conductivity type overlying said base region;
forming recesses through a major portion of said base region at locations laterally spaced from said emitter region, said recesses being formed by:
(a) forming an insulating layer on the surface of said second layer of semiconductor material;
(b) forming a sidewall insulator on the side portion of said second layer of semiconductor material; and
(c) etching recesses through at least a major portion of said base region at locations adjacent to said sidewall insulator;
introducing impurities of said first conductivity type in selected ones of said recesses to form a base contact region adjacent to said base region; and
introducing impurities of said second conductivity type in other ones of said recesses at locations laterally spaced from said base contact region to form a collector contact region adjacent to said first layer of semiconductor material.

15. The method recited in claim 14, wherein said step of introducing impurities of said first conductivity type comprises implanting boron into said selected ones of said recesses at locations that are self-aligned to a sidewall insulator formed on the side portions of said second layer of semiconductor material.

16. The method recited in claim 14, wherein said step of introducing impurities of said second type comprises:
forming a sidewall insulator overlying at least a portion of the sides of said emitter region and the walls of said recesses; and
implanting phosphorus into said other ones of said recesses.

* * * * *